United States Patent [19]

Wu

[11] Patent Number: 5,759,893
[45] Date of Patent: Jun. 2, 1998

[54] METHOD OF FABRICATING A RUGGED-CROWN SHAPED CAPACITOR

[75] Inventor: Shye-Lin Wu, Hsinchu Hsien, Taiwan

[73] Assignee: Powerchip Semiconductor Corp., Hsin-Chu, Taiwan

[21] Appl. No.: 759,615

[22] Filed: Dec. 5, 1996

[51] Int. Cl.⁶ .................................................. H01L 21/8242
[52] U.S. Cl. ............................ 438/254; 438/255; 438/398
[58] Field of Search ............................... 437/47, 48, 52, 437/60, 919; 438/254, 255, 397, 398

[56] References Cited

U.S. PATENT DOCUMENTS

| | | | |
|---|---|---|---|
| 5,266,514 | 11/1993 | Tuan et al. | 437/52 |
| 5,286,668 | 2/1994 | Chou | 437/52 |
| 5,578,516 | 11/1996 | Chou | 437/52 |

Primary Examiner—John Niebling
Assistant Examiner—Joni Y. Chang
Attorney, Agent, or Firm—Ladas & Parry

[57] ABSTRACT

A method of fabricating a rugged-crown shaped capacitor on a semiconductor substrate is provided. Specifically, the method can be applied for fabricating a storage capacitor of a DRAM cell. A doped polysilicon layer is deposited on the substrate and patterned to retain the portion of the doped polysilicon layer within a planned region of the capacitor. Next, an undoped polysilicon layer is deposited on the doped polysilicon layer and the substrate and etched back as undoped polysilicon spacers. Then the doped layer and the undoped spacers are selectively etched by a hot $H_3PO_4$ solution to form a crown-shaped node of the capacitor with a rugged surface. Then the undoped portion of the crown-shaped node of the capacitor is doped and the rugged-crown shaped node forms a conductive plate of the DRAM capacitor, providing a rugged-crown shaped capacitor having a larger area to increase its capacitance.

14 Claims, 5 Drawing Sheets

METHOD OF FABRICATING A RUGGED-CROWN SHAPED CAPACITOR

BACKGROUND OF THE INVENTION

1. Field of the Invention

The present invention generally relates to semiconductor devices and more specifically to a method of fabricating a rugged-crown shaped capacitor for high-density dynamic random access memories (DRAMs).

2. Description of the Prior Art

Currently, the most popular type of DRAM cells is the single transistor DRAM cell, which merely includes access NMOS transistor 2 and storage capacitor 4, as shown in FIG. 1 (PRIOR ART). Storage capacitor 4, which is connected to the source of access transistor 2, is used for storing information according to its charge condition. The gate and the drain of transistor 2 are connected to word line WL and bit line BL, respectively. Word line WL turns on or turns off access transistor 2 so as to control the access path between the bit line BL and capacitor 4. It is noted that data stored in DRAM cells is not permanent and will be lost after a period. Therefore, each DRAM cell must be periodically refreshed so that the stored data remains correct. The time interval between "refresh" cycle is called the refresh time. Typically, the refresh procedure is performed by a DRAM peripheral circuit.

The storage capacitor is of essential importance in the data-storing mechanism of DRAM cells. It is known that the soft error caused by noise is reduced and the refresh frequency is lower when the capacitance of the storage capacitor increases. Therefore, it is a critical issue in the DRAM technology as to how to increase the capacitance of the storage capacitor. In general, the capacitance can be increased by making the capacitor dielectric thinner, by using an insulator with a larger dielectric constant, or by increasing the area of the capacitor. Specifically, the third scheme (increasing the capacitor area) has been widely developed and applied for fabricating high-capacity DRAMs.

Increasing the capacitor area can be obtained by forming the storage capacitor in a trench etched in the substrate or by using a stacked capacitor structure. However, trench capacitors used in 16M or higher DRAMs require very deep trenches within the silicon substrate, which may be limited by the physical dimensions of the substrate. In addition, recently developed stacked capacitors have somewhat complicated structures and making such stacked capacitors is difficult and costly.

One approach to form a three-dimensional capacitor is disclosed in U.S. Pat. No. 5,286,668 and is provided here for reference. Referring to FIG. 2 (PRIOR ART), one node of the disclosed capacitor consists of doped polysilicon portion 6 and undoped polysilicon portion 8. Undoped polysilicon portion 8 is doped with impurities in the subsequent step. In addition, the node of the capacitor is coupled to source 12 of a MOS transistor, which is embedded in substrate 10. In FIG. 2, a doped polysilicon layer (not shown in FIG. 2) has been etched by using phosphoric acid at a temperature of about 140°–180° C., to form the doped polysilicon portion 6. The wet etching process using phosphoric acid has a high etching selectivity between doped polysilicon material and undoped polysilicon material. Such a process can increase the capacitance by enlarging the surface of the polysilicon electrode plate, including the portions 6 and 8. However, the increment of the capacitor area is quite limited. However, the increased capacitance is not sufficient to meet the future requirement, especially in the making of the higher capacity DRAM.

SUMMARY OF THE INVENTION

An object of the present invention is to provide a method of fabricating a capacitor with a larger area in a semiconductor substrate.

Another object of the present invention is to provide a method of fabricating a storage capacitor, which has crown-shaped plates with a rugged surface and can be used in a DRAM cell.

The present invention achieves the above-indicated objectives by providing a method for manufacturing a rugged-crown capacitor on a substrate. The method includes the following steps:

depositing a doped polysilicon layer on the substrate;

patterning the doped polysilicon layer to keep a portion of the doped polysilicon layer within a planned region of the capacitor;

depositing an undoped polysilicon layer on the doped polysilicon layer and the substrate;

anisotropically etching the undoped polysilicon layer as undoped polysilicon spacers adjacent to the doped polysilicon layer;

selectively etching the doped polysilicon layer and the undoped polysilicon spacers by hot phosphoric acid ($H_3PO_4$ at 140°–180° C.) to form a crown-shaped node of the capacitor with a rugged surface;

doping the undoped portion of the crown-shaped node of the capacitor;

forming a dielectric layer on the crown-shaped node; and forming a cell plate on the dielectric layer.

The resulting crown-shaped node with the rugged surface provides a capacitor with a larger area and a correspondingly larger capacitance.

Further, the method of fabricating a rugged-crown shaped capacitor described above can be applied to the making of the storage capacitor in a DEN cell. Some additional steps are included. An isolation layer and an anti-reflection coating (ARC) layer are successively deposited before the step of depositing the doped polysilicon layer. The isolation layer may be made of tetraethylorthosilicate (TEOS), while the ARC layer may be made of silicon nitride ($Si_3N_4$). Then, in the isolation layer and the ARC layer a contact hole is formed. The doped polysilicon layer can contact with the source of the MOS device in the DRAM cell via the contact hole. Finally, the ARC layer is also removed by the etching step using the hot $H_3PO_4$ solution.

Various other objects, advantages and features of the present invention will become readily apparent from the ensuring detailed description, and the novel features will be particularly pointed out in the appended claims.

BRIEF DESCRIPTION OF THE DRAWINGS

The following detailed description, given by way of example and not intended to limit the invention solely to the embodiments described herein, will best be understood in conjunction with the accompanying drawings, in which.

DETAILED DESCRIPTION OF THE PREFERRED EMBODIMENTS

Figure 1:
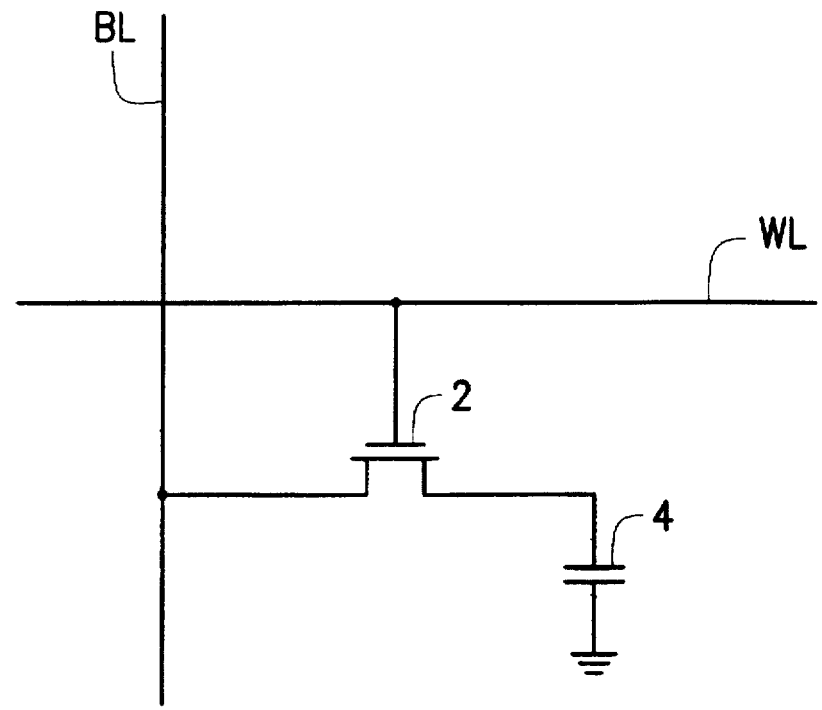
FIG. 1 (PRIOR ART) schematically illustrates a circuit diagram of a DRAM cell.
Figure 2:
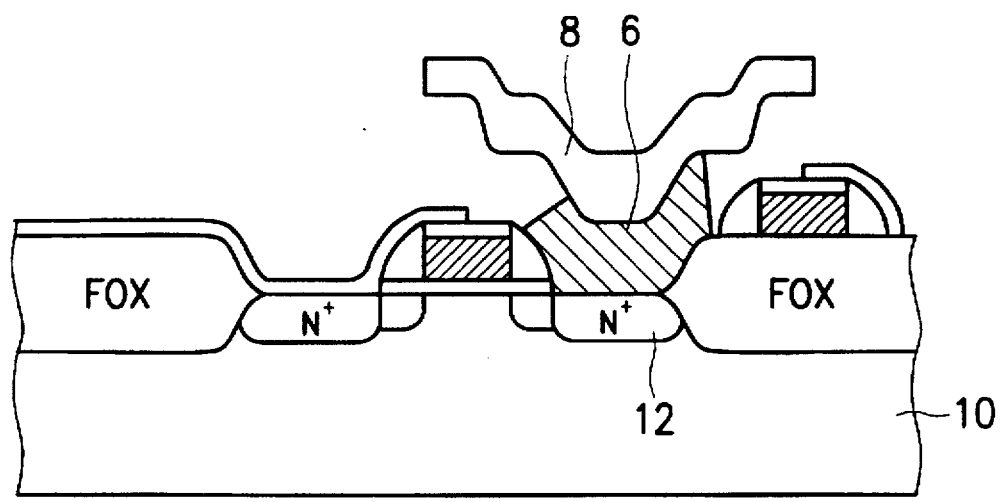
FIG. 2 (PRIOR ART) schematically illustrates a cross-sectional view of a conventional DRAM capacitor having a node connected to a DRAM transistor.

Referring to FIGS. 3A–3H, a method of fabricating a DRAM capacitor on substrate 10 in accordance with the present invention is provided.

Field oxide 20 and a transistor device having gate electrode 34, source region 36 and drain region 38 are conventionally formed on substrate 10. In addition, conductive line 42, gate oxide 32 of the MOS transistor, and sidewall spacers 40 are provided.

Having the conventional formation in place, the manufacturing method of the present invention includes the following steps:

STEP 1

Figure 3A:
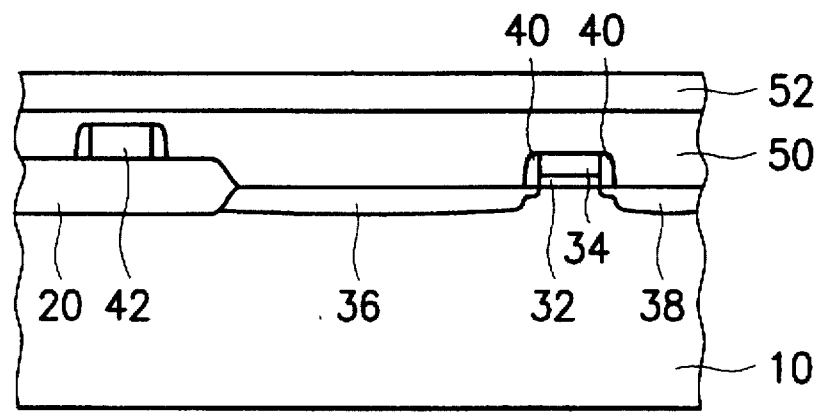
FIGS. 3A–3H are cross-sectional views which illustrate the manufacturing process of the present invention.

Referring to FIG. 3A, oxide layer 53, which may be made of tetraethylorthosilicate (TEOS) and has a thickness of about 3000–10000 Å, is deposited on substrate 10 by chemical vapor deposition (CVD) or other deposition techniques. Oxide layer 50 is used for isolating substrate 10 and other devices formed thereon from the DRAM capacitor formed later. In addition, anti-reflection coating (ARC) layer 52, which may be made of silicon nitride ($Si_3N_4$) in this embodiment, is further deposited on oxide layer 50. ARC layer 52 can prevent reflection during the photolithography process.

STEP 2

Figure 3B:
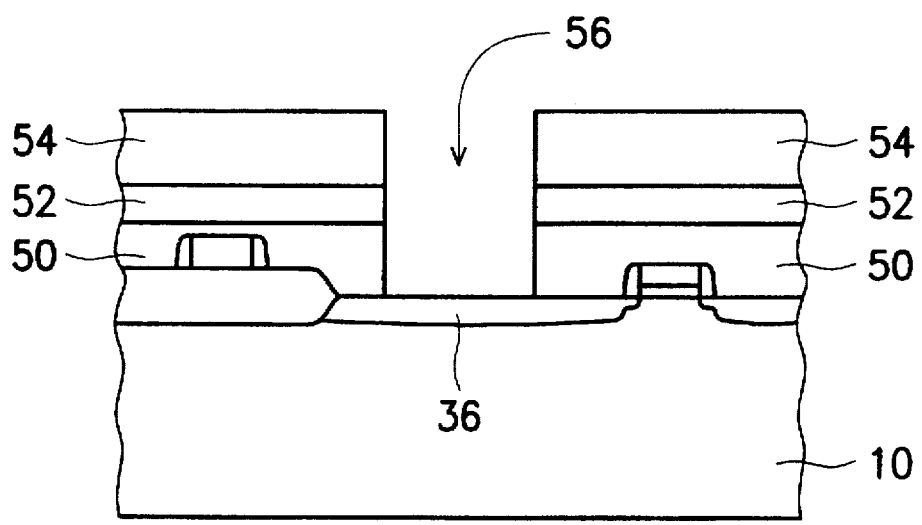

Referring to FIG. 3B, oxide layer 50 and ARC layer 52 are patterned by using mask photoresist layer 54, and then contact hole 56 is formed. Contact hole 56 is provided for connecting source region 36 of the MOS transistor with the DRAM capacitor formed later. In this embodiment, $Si_3N_4$ ARC layer 52 and TEOS oxide layer 50 are conventionally removed by dry etching. Photoresist layer 56 is subsequently removed.

STEP 3

Figure 3C:
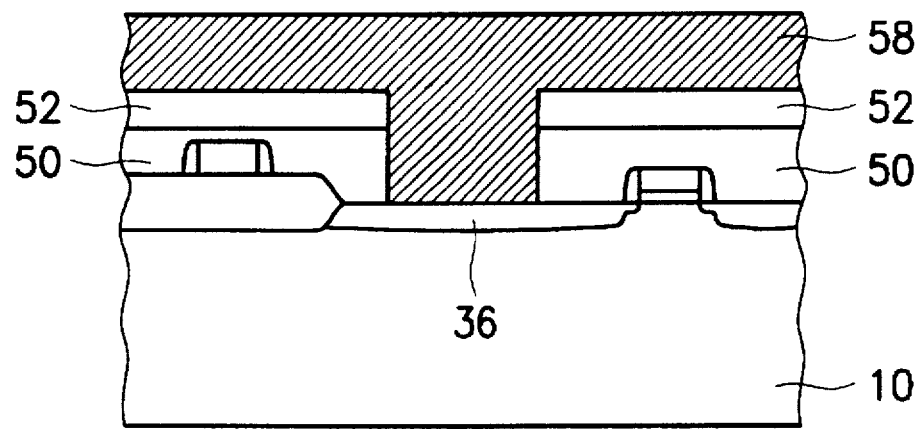

Referring to FIG. 3C, thick doped polysilicon layer 58 having a thickness of about 2000–10000 Å is deposited on ARC layer 52 and fills contact hole 56 by CVD or other deposition techniques. Doped polysilicon layer 58 becomes electrically connected to source region 36 of the MOS transistor. In this embodiment, doped polysilicon layer 58 is doped with phosphorous material by using in-situ doping. It will be apparent to those skilled in the art that the in-situ dopant can also be arsenic (As) material. Preferably, the dope concentration of doped polysilicon layer 58 is greater than or equal to $10^{20}$ atoms/$cm^3$.

STEP 4

Figure 3D:
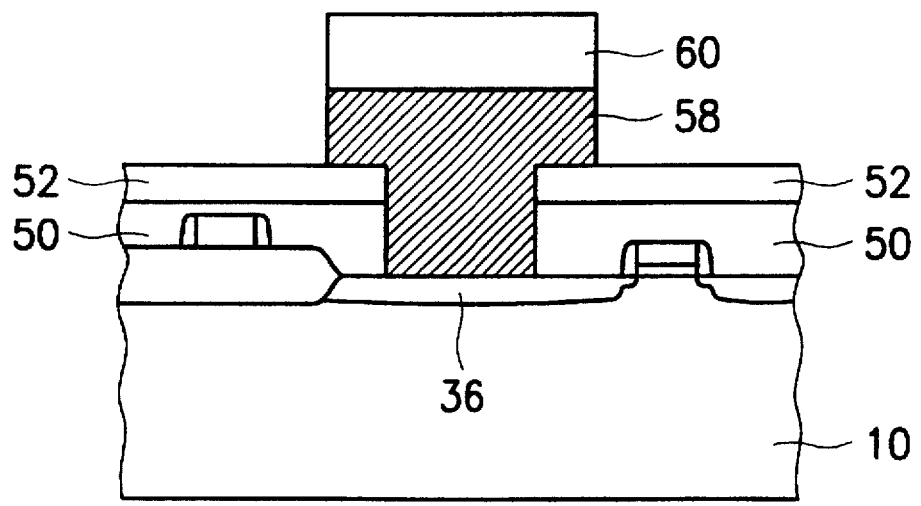

Referring to FIG. 3D, photoresist layer 60 is patterned and doped polysilicon layer 58 is etched by using patterned photoresist layer 60, resulting in remaining the portion of doped polysilicon layer 58 within a planned region of the DRAM capacitor. Photoresist layer 60 is subsequently removed.

STEP 5

Figure 3E:
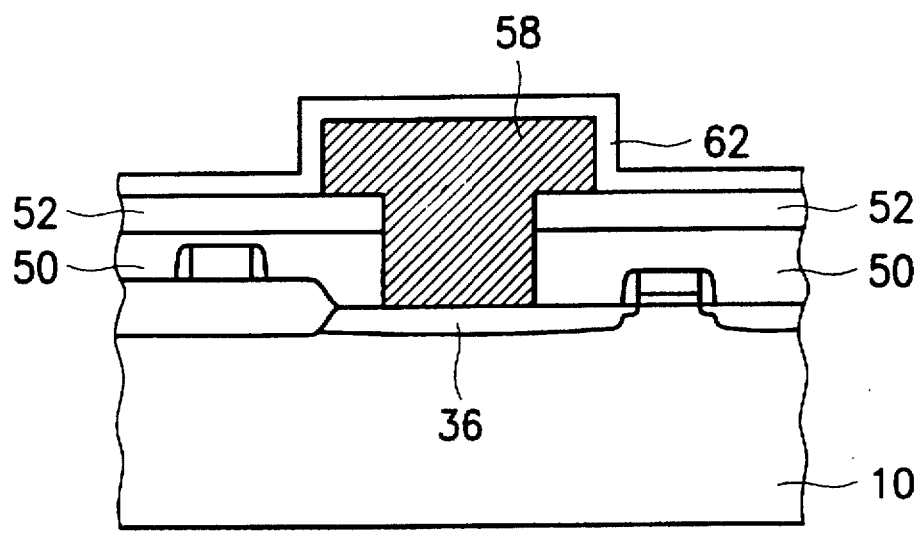

Referring to FIG. 3E, undoped polysilicon layer 62 having a thickness of about 300–2000 Å is deposited on patterned polysilicon layer 58 and ARC layer 52 by CVD or other deposition techniques.

STEP 6

Figure 3F:
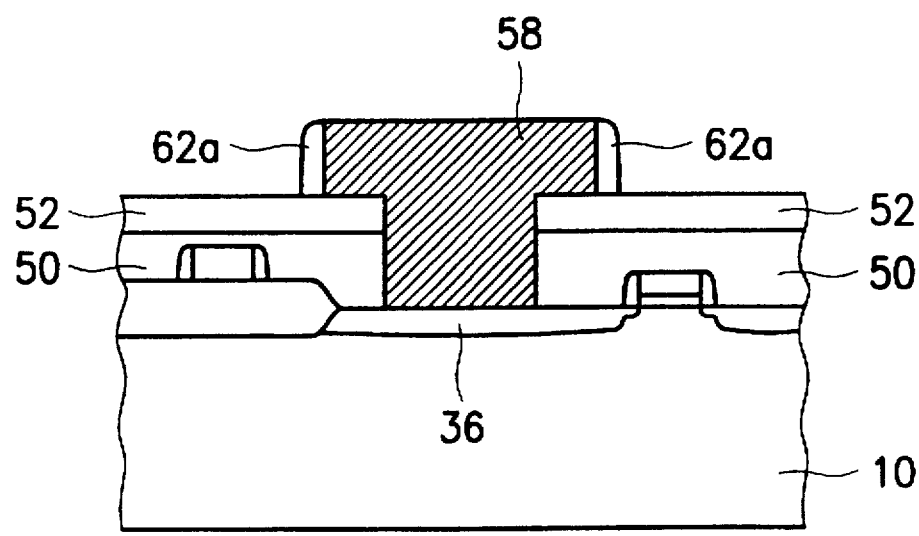

Referring to FIG. 3F, undoped polysilicon layer 62 is anisotropically etched back as undoped polysilicon spacers 62a adjacent to doped polysilicon layer 58.

STEP 7

Figure 3G:
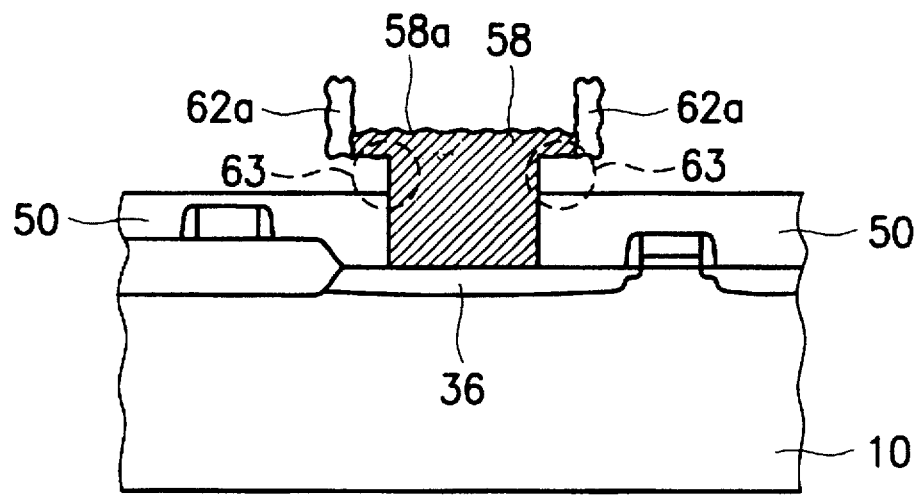

Referring to FIG. 3G, doped polysilicon layer 58 and undoped polysilicon spacers 62a are selectively etched by hot phosphoric acid ($H_3PO_4$) at about 140°–180° C. It is known that the hot phosphoric acid solution has a high etching selectivity with respect to doped and undoped polysilicon material. Therefore, doped polysilicon layer 58 over ARC layer 52 is almost removed except for doped polysilicon base 58a. Base 58a combined with undoped polysilicon spacers 62 form a crown-shaped node of the DRAM capacitor. In addition, the crown-shaped node, which consists of doped polysilicon base 58 and undoped polysilicon spacers 62a, has a rugged surface due to the structure of polysilicon grains. It is apparent that the rugged-crown shaped node has a very large surface area, including recessed portions 63. In addition, ARC layer 52 is also removed by the hot phosphoric acid solution.

STEP 8

Figure 3H:
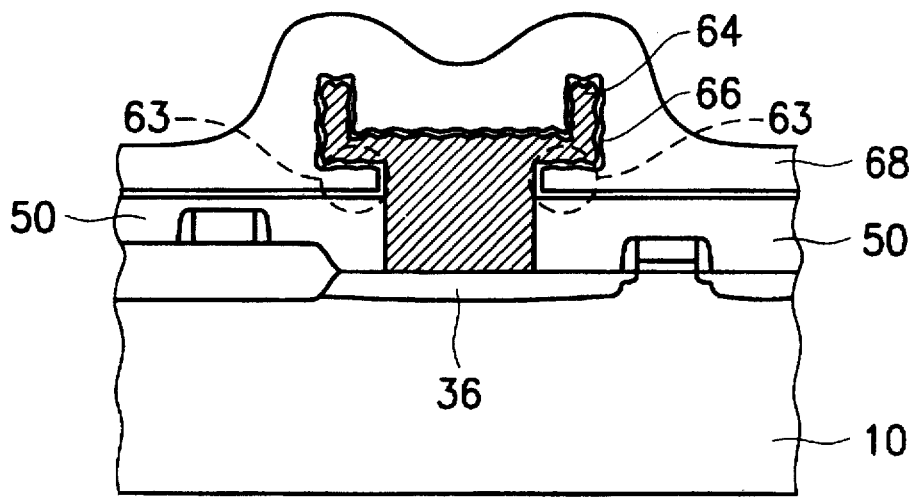

Referring to FIGS. 3G and 3H, the rugged-crown shaped node of the DRAM capacitor includes a non-conductive portion, undoped polysilicon spacers 62a. In this step, undoped polysilicon spacers 62a are doped with phosphorus material, such as $POCl_3$ or $PH_3$. Therefore, the rugged-crown shaped node consisting doped base 58a and doped spacers 62a becomes conductive plate 64 of the DRAM capacitor.

STEP 9

Referring to FIG. 3H, dielectric layer 66 and conductive cell plate 68 are conventionally deposited on conductive plate 64, completing the DRAM capacitor having a larger area.

A manufacturing method of a rugged-crown shaped DRAM capacitor by using the present invention is described above step by step. However, it is well understood by those skilled in the art that such a manufacturing method can be applied to fabricate any kind of capacitors in integrated circuits in a similar manner. In this case, some dedicated steps for a standard DRAM process may be omitted, such as Step 1 and Step 2 in the preferred embodiment, while some additional steps are included to meet the practical requirement.

The foregoing description of preferred embodiments of the present invention has been provided for the purposes of illustration and description. It is not intended to be exhaustive or to limit the invention to the precise forms disclosed. Many modifications and variations will be apparent to practitioners skilled in this art. The embodiments were chosen and described to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

What is claimed is:

1. A method of fabricating a rugged-crown shaped capacitor on a substrate, the substrate including a semiconductor device source region, the method comprising the steps of:

depositing a doped polysilicon layer on the substrate, the doped polysilicon layer contacting the semiconductor device source region;

patterning the doped polysilicon layer to retain a portion of the doped polysilicon layer adjacent to the semiconductor device source region;

depositing an undoped polysilicon layer on the doped polysilicon layer and the substrate;

anisotropically etching the undoped polysilicon layer to form undoped polysilicon spacers adjacent to the doped polysilicon layer;

selectively etching the doped polysilicon layer and the undoped polysilicon spacers by a hot phosphoric acid solution to form a crown-shaped node of the capacitor with a rugged surface;

doping an undoped portion of the crown-shaped node of the capacitor;

forming a dielectric layer on the crown-shape node; and forming a cell plate on the dielectric layer.

2. The method of claim 1 wherein the step of depositing the doped polysilicon layer uses phosphoric material as dopant and has a concentration of equal to or greater than $10^{20}$ atoms/cm$^3$.

3. The method of claim 2 wherein the doped polysilicon layer is doped by in-situ doping.

4. The method of claim 1 wherein the step of depositing the doped polysilicon layer uses arsenic material as dopant and has a concentration of equal to or greater than $10^{20}$ atoms/cm$^3$.

5. The method of claim 4 wherein the doped polysilicon layer is doped by in-situ doping.

6. The method of claim 1 wherein the undoped portion of the rugged-crown shaped node is: doped by $POCl_3$ or $PH_3$.

7. A method of fabricating a rugged-crown shaped capacitor on a substrate having a semiconductor device source region, the method comprising the steps of:

depositing an isolation layer on the substrate;

depositing an anti-reflection coating layer on the isolation layer;

patterning the isolation layer and the anti-reflection coating layer to form a contact hole to an electrode of the semiconductor device;

depositing a doped polysilicon layer on the anti-reflection coating layer and within the contact hole, the doped polysilicon layer being electrically connected to the electrode of the semiconductor device;

patterning the doped polysilicon layer to retain a portion of the doped polysilicon layer adjacent to the semiconductor source region;

depositing an undoped polysilicon layer on the doped polysilicon layer and the isolation layer;

anisotropically etching the undoped polysilicon layer to form undoped polysilicon spacers adjacent to the doped polysilicon layer;

selectively etching the doped polysilicon layer and the undoped polysilicon spacers and removing the anti-reflection coating layer by a hot phosphoric acid solution to form a crown-shaped node of the capacitor with a rugged surface;

doping the undoped polysilicon spacers of the crown-shaped node of the capacitor;

forming a dielectric layer on the crown-shaped node; and forming a cell plate on the dielectric layer.

8. The method of claim 7 wherein the isolation layer is made of tetraethylorthosilicate (TEOS).

9. The method of claim 7 wherein the anti-reflection coating layer is made of silicon nitride.

10. The method of claim 7 wherein the step of depositing the doped polysilicon layer uses phosphoric material as dopant and has a concentration of equal to or greater than $10^{20}$ atoms/cm$^3$.

11. The method of claim 10 wherein the doped polysilicon layer is doped by in-situ doping.

12. The method of claim 7 wherein the step of depositing the doped polysilicon layer uses arsenic material as dopant and has a concentration of equal to or greater than $10^{20}$ atoms/cm$^3$.

13. The method of claim 12 wherein the doped polysilicon layer is doped by in-situ doping.

14. The method of claim 7 wherein the undoped portion of the rugged-crown shaped node is doped by $POCl_3$ or $PH_3$.

* * * * *